United States Patent
Sessego et al.

(10) Patent No.: US 9,475,689 B2
(45) Date of Patent: Oct. 25, 2016

(54) MEMS PARAMETER IDENTIFICATION USING MODULATED WAVEFORMS

(71) Applicant: FREESCALE SEMICONDUCTOR, INC., Austin, TX (US)

(72) Inventors: Raimondo P. Sessego, Austin, TX (US); Tehmoor M. Dar, Austin, TX (US); Bruno J. Debeurre, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/017,786

(22) Filed: Feb. 8, 2016

(65) Prior Publication Data

US 2016/0152464 A1   Jun. 2, 2016

Related U.S. Application Data

(62) Division of application No. 13/948,775, filed on Jul. 23, 2013.

(51) Int. Cl.
| | |
|---|---|
| *G01P 21/00* | (2006.01) |
| *B81B 3/00* | (2006.01) |
| *G01P 15/125* | (2006.01) |
| *G01P 15/08* | (2006.01) |

(52) U.S. Cl.
CPC .......... *B81B 3/0021* (2013.01); *G01P 15/125* (2013.01); *G01P 21/00* (2013.01); *G01P 2015/0834* (2013.01)

(58) Field of Classification Search
CPC ...... G01P 21/02; G01P 21/00; G01P 15/125; G01C 19/5719
USPC ............ 73/1.37, 1.01, 1.38, 504.12, 514.32; 324/601
See application file for complete search history.

(56) References Cited

U.S. PATENT DOCUMENTS

| | | | | |
|---|---|---|---|---|
| 7,121,141 | B2 * | 10/2006 | McNeil | G01P 15/125 73/514.01 |
| 7,610,809 | B2 * | 11/2009 | McNeil | G01P 15/125 73/514.32 |
| 7,721,604 | B2 * | 5/2010 | Pruetz | G01P 15/125 73/514.32 |
| 7,812,680 | B1 * | 10/2010 | Brown | H03C 3/42 331/116 M |
| 2012/0186346 | A1 * | 7/2012 | McNeil | G01P 15/125 73/514.32 |
| 2012/0216616 | A1 * | 8/2012 | Schultz | G01P 15/125 73/514.38 |
| 2012/0223726 | A1 * | 9/2012 | Zhang | B81B 3/0051 324/658 |
| 2012/0235725 | A1 * | 9/2012 | Elmallah | G01C 19/5776 327/299 |
| 2013/0139595 | A1 * | 6/2013 | Tsai | G01P 15/125 73/514.32 |
| 2013/0333471 | A1 * | 12/2013 | Chien | G01P 15/0802 73/514.32 |

* cited by examiner

*Primary Examiner* — Lisa Caputo
*Assistant Examiner* — Nigel Plumb

(57) ABSTRACT

A sensor system includes a microelectromechanical systems (MEMS) sensor, control circuit, signal evaluation circuitry, a digital to analog converter, signal filters, an amplifier, demodulation circuitry and memory. The system is configured to generate high and low-frequency signals, combine them, and provide the combined input signal to a MEMS sensor. The MEMS sensor is configured to provide a modulated output signal that is a function of the combined signal. The system is configured to demodulate and filter the modulated output signal, compare the demodulated, filtered signal with the input signal to determine amplitude and phase differences, and determine, based on the amplitude and phase differences, various parameters of the MEMS sensor. A method for determining MEMS sensor parameters is also provided.

20 Claims, 5 Drawing Sheets

10

MEMS PARAMETER IDENTIFICATION USING MODULATED WAVEFORMS

This application is a divisional application of U.S. application Ser. No. 13/948,775, having a filing date of Jul. 23, 2013, having common inventors, and having a common assignee, all of which is incorporated by reference in its entirety.

TECHNICAL FIELD OF THE INVENTION

The present invention relates generally to microelectromechanical systems (MEMS) devices utilized in electronic systems. More specifically, the present invention relates to electrically testing and identifying parameters of MEMS devices utilizing modulated waveforms.

BACKGROUND OF THE INVENTION

Microelectromechanical Systems (MEMS) sensors are widely used in applications such as automotive electronics, inertial guidance systems, household appliances, consumer electronics, protection systems, and many other industrial, scientific, engineering and portable systems. Such MEMS sensors are used to sense a physical condition such as, for example, acceleration, pressure, angular rotation, or temperature, and to provide an electrical signal representative of the sensed physical condition to the applications and/or systems employing the MEMS sensors. The applications and/or systems may utilize the information provided by the MEMS sensor to perform calculations, make decisions, and/or take certain actions based on the sensed physical condition.

BRIEF DESCRIPTION OF THE DRAWINGS

A more complete understanding of the present invention may be derived by referring to the detailed description and claims when considered in connection with the Figures (not necessarily drawn to scale), wherein like reference numbers refer to similar items throughout the Figures, and:

DETAILED DESCRIPTION

Figure 1:
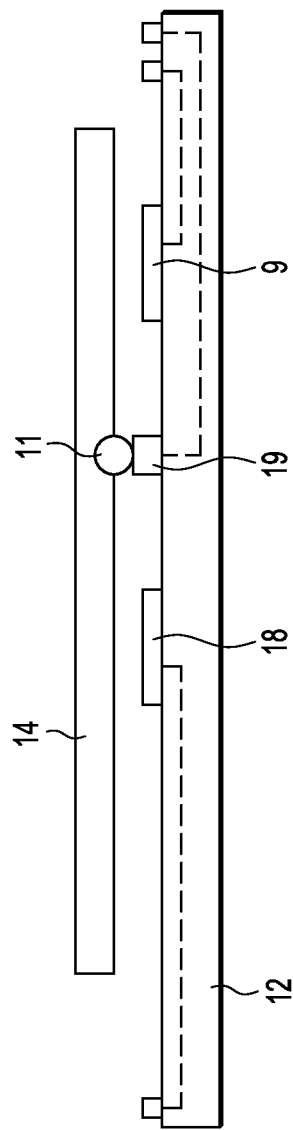
FIG. 1 shows a simplified side view of a MEMS sensor configured in accordance with the teaching of an embodiment.

Capacitive-sensing MEMS designs are highly desirable for operation in acceleration, angular rotation, pressure environments and in miniaturized devices due to their relatively low cost. When subjected to acceleration, angular rotation, pressure, or some other external stimulus to which the MEMS device is designed to be responsive, capacitive sensing MEMS devices provide a change in electrical capacitance that corresponds to the magnitude of the applied stimulus. In other words, the electrical output at a given time of a MEMS device corresponds to the magnitude of the stimulus applied to that MEMS device at that given time. In this manner, by monitoring the electrical output of a MEMS device, a system may determine the magnitude of external stimuli applies to various MEMS devices (pressure, acceleration, angular rotation, etc.), and use that information to help determine what actions the system should take responsive to the stimuli. For example, an automotive air bag system sensing a rapid deceleration of the automobile based on the electrical output of a MEMS accelerometer device may determine that it is necessary to deploy an airbag in order to protect a vehicle occupant. One common form of MEMS device is an accelerometer in the form of a two layer capacitive transducer having a "teeter-totter" or "see saw" configuration. This commonly utilized transducer type uses a movable element or plate that rotates under z-axis acceleration above a substrate. The accelerometer structure can measure two distinct capacitances to determine differential or relative capacitance, and provide that information as an output to the MEMS accelerometer. Other MEMS devices designed to sense other applied stimuli may take on various forms, provided that the output of the MEMS device is configured to correspond to the magnitude of the stimulus being monitored.

The electro-mechanical characteristics, also referred to as parameters, of each MEMS device may differ due to a variety of factors (manufacturing tolerances, slight differences in processing depending on where and when the MEMS device was manufactured, etc.). This means that the electrical output of one MEMS device responsive to a certain magnitude of stimulus might be different from the electrical output of a second MEMS device responsive to a stimulus of the very same magnitude. Because systems employing MEMS devices may use the electrical output to calculate the extent of the stimulus, and may use the result of that calculation to determine whether or not to take a certain action (such as, for example, deploying an airbag), it is important that parameters of MEMS devices be identified and evaluated such that a system employing MEMS sensors can be compensated (for offset) and calibrated (for gain) to correlate a given electrical output from the MEMS sensor to a specific amount of applied stimulus. Typically, identification and evaluation of MEMS parameters, and calibration of the system employing the MEMS sensors, occurs prior to shipment of the system employing the MEMS sensor. Parameter identification and evaluation may be accomplished by applying the actual physical stimulus (for example, acceleration) to the system, measuring the electrical response of the MEMS sensor, and storing values representative of the MEMS parameters in the system, along with values representative of any "correction" or calibration factors that need to be applied to the electrical output of the MEMS sensor in light of the MEMS parameters. Identification of the MEMS parameters and application of correction or calibration factors to the MEMS output help to make sure that the MEMS sensor output corresponds to the magnitude of the applied stimulus.

Although physically applying various stimuli to MEMS sensors, and systems employing MEMS sensors, can serve to identify MEMS parameters and provide resulting calibration data such that the system can function properly, such physical testing can be expensive, time-consuming and damaging to the system being tested. Furthermore, the need to physically test a variety of systems and applications employing MEMS sensors can require numerous, application-specific test stations to be designed and built for each application to be tested, increasing the cost and time associated with such testing. In addition, although physical testing prior to shipment of MEMS sensors, and systems employing MEMS sensors, can provide parameter values that may be accurate at the time of testing, such testing ignores the fact that over time (and as a result of use and/or damage), the electro-mechanical parameters of the MEMS devices may change, making the initial parameter values no longer accurate, and possibly causing system malfunction. Finally, in the event of a system malfunction, attempts to determine the cause of the malfunction can be complicated by requiring that the system employing the MEMS device be physically removed from the end application (such as, for example, an automobile) so that the MEMS device can again be physically tested MEMS parameters evaluated. Such a requirement can make maintenance and repair of systems employing MEMS devices cost-prohibitive.

In one aspect, a system and method are provided for the electrical determination of MEMS device parameters utilizing modulating electromagnetic signals, without a need for applying physical forces external to the MEMS device. In an additional aspect, a system and method are provided for testing, monitoring and evaluating MEMS device parameters utilizing modulating electromagnetic signals throughout the lifetime of those MEMS devices and while those devices remain located and functioning in systems employing the MEMS devices. Thus, in some embodiments, systems and methods achieving design objectives of low-cost MEMS sensor testing, repeated identification and evaluation of MEMS sensor parameters throughout the life of the MEMS sensors, testing of MEMS sensors without removal of the sensors from the application, and re-calibration of systems employing MEMS devices during the life of the MEMS devices are provided.

FIG. 1 shows a simplified side view of a MEMS sensor 10 configured in accordance with the teaching of an embodiment. MEMS sensor 10 is an electromechanical z-axis sensor configured with at least one moveable mechanical element 14. The moveable mechanical element 14 is a conductive metalloid plate physically coupled to a substrate 12 of MEMS sensor 10 by means of a mounting system. In an alternative embodiment, moveable mechanical element 14 is made of any material capable of conducting electrical signals. The simplified diagram of FIG. 1 shows the mounting system comprising a pedestal 19 which is physically coupled to the substrate 12 and a torsion bar 11 defining a flexure axis about which moveable mechanical element 14 may rotate, physically coupled to pedestal 19 and moveable mechanical element 14. Torsion bar 11 and pedestal 19 are made of conductive material. Because moveable mechanical element 14, torsion bar 11, and pedestal 19 are all made of conductive material and coupled together, moveable mechanical element 14, torsion bar 11, and pedestal 19 are all at the same potential, such that an electromagnetic signal applied to pedestal 19 will be conducted into moveable mechanical element 14. Pedestal 19 and torsion bar 11 serve to suspend moveable mechanical element 14 above and substantially parallel to the surface of substrate 12 in the absence of physical or other forces applied to the MEMS sensor 10. Non-illustrated conductors are formed in the substrate 12 such that pedestal 19 is electrically coupled to a surface contact of MEMS sensor 10 located on a surface of substrate 12 to permit electrical contact to circuitry external to MEMS sensor 10, and such that electromagnetic signals applied to the surface contact are conducted into pedestal 19. MEMS sensor 10 further comprises sense contacts 18 and 9 made of electrically conducting material and coupled to the upper surface of substrate 12. Non-illustrated conductors are formed in the substrate 12 such that sense contacts 18 and 9 are each electrically coupled to surface contacts of MEMS sensor 10 located on a surface of substrate 12 to permit electrical contact to circuitry external to MEMS sensor 10, and such that electromagnetic signals applied to the surface contacts are conducted into sense contacts 18 and 9, and such that electromagnetic signals created by movement of mechanical element 14 relative to sense contacts 18 and 9 are conducted into the surface contacts. The area between the upper surface of contact 18 and the lower surface of moveable mechanical element 14 forms a first capacitor, and the area between the upper surface of contact 9 and the lower surface of moveable mechanical element 14 forms a second capacitor. Application of a voltage differential between the moveable mechanical element 14 and sense contact 18 may induce movement in moveable mechanical element 14, and application of a voltage differential between the moveable mechanical element 14 and sense contact 9 may induce movement in moveable mechanical element 14. Furthermore, physical movement of moveable mechanical element 14 causes a change in capacitance of the first capacitor and/or the second capacitor.

Moveable mechanical element 14 is configured to move (about the axis formed by torsion bar 11) relative to the surface of substrate 12 and sense contacts 18 and 9 of MEMS sensor 10 responsive to physical and/or electrical stimuli applied to MEMS sensor 10 and/or moveable mechanical element 14. Moveable mechanical element 14 has a pre-determined range of travel relative to the substrate 12. When moveable mechanical element 14 is caused to move by a physical, electromagnetic, or other stimuli to which moveable mechanical element 14 is exposed, an electromagnetic signal is conducted into sense contacts 18 and 9 of MEMS sensor 10, and into their surface contacts. This electromagnetic signal varies according to the movement of the moveable mechanical element 14 relative to sense contacts 18 and 9 within the predefined range of travel. In an embodiment, MEMS sensor 10 is configured such that, when the moveable mechanical element 14 of MEMS sensor 10 moves, it continuously provides capacitance values at sense contacts 18 and 9 that correspond to the magnitude of the motion of the moveable mechanical element 14.

In addition, moveable mechanical element 14 of MEMS sensor 10 is configured to receive electromagnetic input signals, such that when electromagnetic input signals are provided to the moveable mechanical element 14 of MEMS sensor 10, such as, for example, via the surface contact of pedestal 19, the moveable mechanical element 14 moves, responsive to the electromagnetic input signals, an amount corresponding to the magnitude and characteristics of the input signals. In an embodiment, MEMS sensor 10 is configured such that when an analog voltage is applied to moveable mechanical element 14, the moveable mechanical element 14 of MEMS sensor 10 moves an amount that corresponds to the magnitude of the analog voltage, and continues to move corresponding to any voltage changes in the input signals. In an embodiment, MEMS sensor 10 is configured such that when the moveable mechanical element 14 of MEMS sensor 10 moves, an analog voltage corresponding to movements of the moveable mechanical portion 14 is provided as an output of MEMS sensor 10 via sense contacts 18 and 9. In an alternative embodiment, MEMS sensor 10 is configured such that when the moveable mechanical element 14 of MEMS sensor 10 moves, a signal other than voltage or capacitance corresponding to the movements of the moveable mechanical element 14 may be provided as an output of MEMS sensor 10 via sense contacts 18 and 9.

In an embodiment, MEMS sensor 10 is a MEMS accelerometer, providing an output signal corresponding to movement of the moveable mechanical element in response to acceleration or deceleration of MEMS sensor 10, or a device in which MEMS sensor 10 is present. In alternative embodiments, MEMS sensor 10 may be any MEMS sensor configured as, for example, an inertial sensor, gyroscope, pressure sensor, or any other MEMS device configured to provide an output signal in response to a physical stimulus, and capable of having an electromagnetic input applied to the moveable mechanical element or proof mass of the MEMS device. It should be appreciated that each MEMS device may have a number of characteristics unique to each individual MEMS device, such as, for example, a resonant frequency, damping characteristics, displacement characteristics, spring constant characteristics, thickness, space between moveable mechanical elements, and other response characteristics. It should also be appreciated that these unique characteristics may change over time, and/or in response to physical forces applied to the MEMS device or environmental conditions such as temperature. MEMS sensor 10 may be formed using existing and upcoming MEMS fabrication design rules and processes that include, for example, deposition, patterning, and etching. In an embodiment, MEMS sensor 10 is a MEMS sensor configured to respond to both physical and electromagnetic stimuli by providing an output signal corresponding to the applied stimulus.

Figure 2:
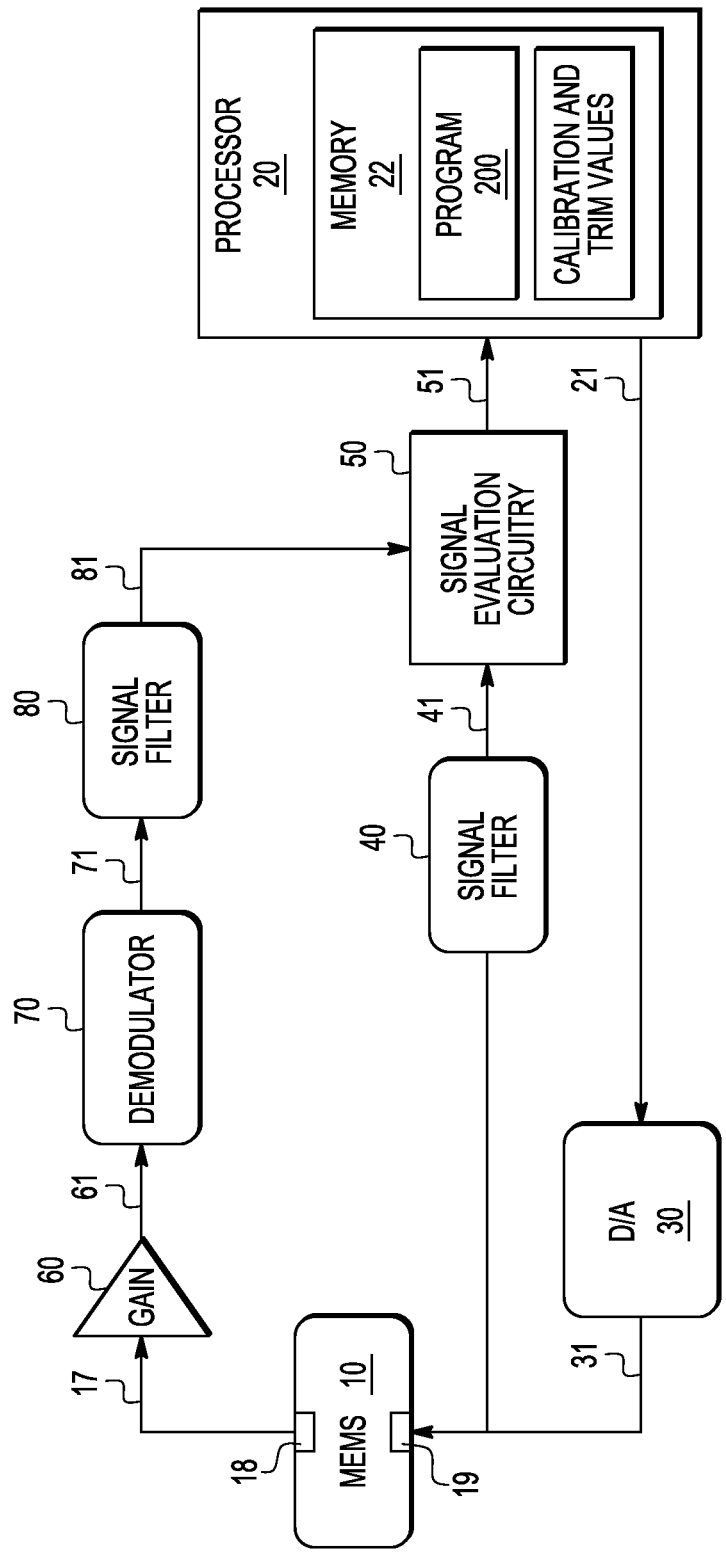
FIG. 2 shows a block diagram of a sensor parameter identification and evaluation system including the MEMS sensor of FIG. 1 configured in accordance with the teaching of an embodiment.

FIG. 2 shows a block diagram of a sensor parameter identification and evaluation system 100 including the MEMS sensor 10 of FIG. 1 configured in accordance with the teaching of an embodiment. Sensor parameter identification and evaluation system 100 is configured to provide signals to a MEMS sensor 10 and determine various parameters of the MEMS sensor 10 based on the response of MEMS sensor 10 to the provided signals. FIG. 2 omits some of the details of the MEMS sensor generally illustrated in FIG. 1. Furthermore, although the MEMS sensor 10 of FIG. 1 is illustrated having two sense contacts, 18 and 9, each associated with a separate capacitor of the MEMS sensor of FIG. 1, FIG. 2. only illustrates sense contact 18 associated with one of the capacitors. It should be appreciated that the operation with respect to sense contact 9 and the second capacitor would be similar to the operation with respect to sense contact 18 and the first capacitor. In an alternative embodiment, MEMS sensor 10 may have only one capacitor and once sense contact.

Sensor parameter identification and evaluation system 100 includes gain circuitry 60 electrically coupled to sense contact 18 of MEMS sensor 10. Gain circuitry 60 is configured to receive an electromagnetic signal 17 from MEMS sensor 10 via sense contact 18, amplify the electromagnetic signal 17, and provide the amplified electromagnetic signal as amplified signal 61 to gain circuitry 60. Electromagnetic signal 17 is a sinusoidal amplitude-modulated signal comprising carrier and data components. Electromagnetic signal 17 includes information that is in part a function electromechanical characteristics of the MEMS sensor 10, and in part a function of input signals applied to MEMS sensor 10.

Sensor parameter identification and evaluation system 100 further comprises demodulator 70 electrically coupled to gain circuitry 60. Demodulator 70 is configured to receive amplified signal 61 as an input from gain circuitry 60, process the received amplified signal 61 to demodulate amplified signal 61 into its component parts (removing the carrier component), and provide as an output amplified demodulated signal 71. In an embodiment, demodulator 70 provides amplitude demodulation, and is configured to demodulate amplitude-modulated signals provided to demodulator 70 via amplified signal 61 into an amplitude-modulated carrier component and a data component carried by the carrier component, remove the amplitude-modulated carrier component, and to provide the demodulated data component as amplified demodulated signal 71.

Sensor parameter identification and evaluation system 100 further comprises low-pass filter 80 electrically coupled to demodulator 70. Low-pass filter 80 is a low-pass filter configured to receive the demodulated data component, amplified demodulated signal 71, as an input from demodulator 70, filter out higher frequency components from amplified demodulated signal 71, and provide the resulting filtered signal as an output, filtered demodulated signal 81. In an embodiment, low-pass filter 80 is configured to filter out high frequencies above 500 kHz and pass low frequencies below 500 kHz.

Sensor parameter identification and evaluation system 100 also includes signal evaluation circuitry 50 electrically coupled to low-pass filter 80 and other elements of sensor parameter identification and evaluation system 100. Signal evaluation circuitry 50 is configured to receive filtered demodulated signal 81 from low-pass filter 80, and is further configured to receive at least one oscillating reference signal from other elements of sensor parameter identification and evaluation system 100 that are electrically coupled to signal evaluation circuitry 50. Signal evaluation circuitry 50 is further configured to determine the amplitude and phase of both filtered demodulated signal 81 and an oscillating reference signal. Signal evaluation circuitry 50 is still further configured to compare the filtered demodulated signal 81 with an oscillating reference signal to determine the amplitude and phase difference between the signals and provide this information as an output via signal 51.

Sensor parameter identification and evaluation system 100 also includes a processor 20 electrically coupled to signal evaluation circuitry 50 and various other components of sensor parameter identification and evaluation system 100. In an alternative embodiment, processor 20 may be any type of processor, including a microcontroller or a state machine or any measurement circuitry used for the purpose of evaluating the signal 51 and providing input signals. Processor 20 includes logic, and is shown having memory 22, and program 200 located in memory 22 and configured to cause processor 20 to perform various functions for sensor parameter identification and evaluation system 100. Memory 22 is non-volatile memory. In an alternative embodiment, memory 22 may be volatile memory. Memory 22 is further shown having calibration and/or trim values associated with MEMS sensor 10 stored in memory 22. As shown in FIG. 2, processor 20 is electrically coupled to signal evaluation circuitry 50 and digital-to-analog converter 30. Processor 20 is configured to generate sinusoidal digital waveform signals responsive to program 200, and provide those sinusoidal digital waveform signals to digital-to-analog converter 30 via signal 21. The digital waveform signals include a high frequency component and a low frequency component. In an embodiment, processor 20 includes a parameter determination and processing program 200 configured to identify and evaluate parameters of MEMS sensor 10 based in part on information provided by signal evaluation circuitry 50 via signal 51. Parameter determination and processing program 200 is shown stored in memory 22. In an alternative embodiment, parameter determination and processing program 200 may be stored in volatile or non-volatile memory locations external to processor 20, or may be hard-wired into processor 20. In yet another alternative embodiment, processor 20 may itself be a hard-wired device.

Processor 20 is configured, responsive to parameter determination and processing program 200, to monitor the operation of MEMS sensor 10 via signal 51, provide sinusoidal input signals comprising both low and high-frequency oscillating components to MEMS sensor 10 to initiate motion of the mechanical element 14 of MEMS sensor 10 responsive to the sinusoidal input signals, and to calculate, monitor, and evaluate parameters of MEMS sensor 10 based on the output of MEMS sensor 10 provided by signal evaluation circuitry 50 via signal 51. Processor 20 is further configured to determine parameters of MEMS sensor 10 responsive to input signals provided by processor 20 to MEMS sensor 10 via signal 21, using information provided by signal evaluation circuitry 50 via signal 51 and characteristics of the input signals. Processor 20 is further configured to perform calculations using the input signals, signal 51, and sensor parameters, to determine, based on the calculations, if the MEMS sensor 10 is operating properly and/or if adjustments need to be made in compensation and calibration values associated with MEMS sensor 10 in sensor parameter identification and evaluation system 100. In an embodiment, the input signal 21, or a derivative of input signal 21, is used as a reference waveform by signal evaluation circuitry 50 to determine parameters of MEMS sensor 10. In an embodiment, processor 20 is further configured to utilize parameter information to calculate updated compensation and calibration values for MEMS sensor 10.

Sensor parameter identification and evaluation system 100 also comprises digital-to-analog converter 30 electrically coupled to processor 20. Digital-to-analog converter 30 is configured to receive sinusoidal signal 21, comprising both high and low-frequency components, from processor 20, convert signal 21 from a digital waveform signal to an analog waveform signal, and provide the resulting analog signal waveform comprising both high and low-frequency components external to digital-to-analog converter 30 via signal 31 to MEMS sensor 10 via pedestal 19.

Continuing with FIG. 2, sensor parameter identification and evaluation system 100 includes a low-pass filter 40 electrically coupled to digital-to-analog converter 30. Low-pass filter 40 is a low-pass filter configured to receive an analog waveform signal comprising both high and low-frequency components, signal 31, as an input from digital-to-analog converter 30, filter out higher frequency components from signal 31, and provide the resulting filtered signal, which acts as a reference signal, as an output filtered reference signal 41. In an embodiment, low-pass filter 40 is configured to filter out high frequencies above 500 kHz and pass low frequencies below 500 kHz. Low-pass filter 40 is further electrically coupled to signal evaluation circuitry 50, and is configured to provide filtered reference signal 41 to signal evaluation circuitry 50 as a reference signal. Signal evaluation circuitry 50 is configured to receive filtered reference signal 41 from low-pass filter 40, and is further configured to determine the amplitude and phase of filtered reference signal 41. Signal evaluation circuitry 50 is still further configured to compare the filtered demodulated signal 81 with the reference signal, filtered reference signal 41, to determine the amplitude and phase difference between the signals, and to provide this information as an output via signal 51.

Returning to digital-to-analog converter 30 of FIG. 2, digital-to-analog converter 30 is further shown electrically coupled to MEMS sensor 10. As noted above, digital-to-analog converter 30 is configured to receive sinusoidal signal 21 from processor 20, convert signal 21 from a digital waveform signal to an analog waveform signal, and provide the resulting analog sinusoidal signal waveform external to digital-to-analog converter 30 via signal 31. Digital-to-analog converter 30 is further configured to provide the resulting analog signal waveform, signal 31, to MEMS sensor 10 via pedestal 19, which will cause moveable mechanical element 14 of MEMS sensor 10 to move responsive to signal 31.

Referring to FIGS. 1 and 2, the operation of sensor parameter identification and evaluation system 100, according to an embodiment of the invention in which parameters and characteristics of a MEMS sensor 10 of sensor parameter identification and evaluation system 100 are being determined and evaluated, is generally described. As a preliminary matter, it should be appreciated that typical moveable mechanical elements of MEMS sensors exhibit both a mechanical movement and reactance response when subjected to a stimulus that is below a certain threshold frequency, but exhibit only a reactance response when subjected to a stimulus that is above that threshold frequency. More specifically, in response to higher frequencies, MEMS sensors act like a capacitor electrically, but do not typically exhibit physical movement. However, in response to lower frequencies, MEMS sensors typically exhibit physical/mechanical movement and also a reactance response. In response to lower frequencies, the reactance response is typically small enough that it is not detected by demodulator 70. It should also be appreciated that while each moveable mechanical element of MEMS sensors typically has a different threshold frequency that is a function of physical properties of the moveable mechanical element, moveable mechanical elements and MEMS sensors having similar design characteristics will typically have similar threshold frequencies. A frequency of less than 10 KHz would be considered a lower frequency, to which a MEMS sensor would typically exhibit both a physical/mechanical and reactance response. A frequency of greater than 500 KHz would be considered a higher frequency, to which a MEMS sensor would typically exhibit only a reactance response.

Responsive to parameter determination and processing program 200, processor 20 generates both a high-frequency digital waveform and a low-frequency digital waveform. The high-frequency digital waveform has a frequency that is higher than the threshold frequency of moveable mechanical element 14 of MEMS sensor 10, and the low-frequency digital waveform has a frequency that is lower than the threshold frequency of moveable mechanical element 14 of MEMS sensor 10. In an embodiment, the high-frequency digital waveform has a frequency above 500 kHz, for example 1 MHz, and the low-frequency digital waveform has a frequency less than or equivalent to the mechanical bandwidth of the MEMS sensor 10, for example between 1 Hz and 10 kHz. Processor 20 then combines the two digital waveforms by adding or summing the two waveforms, and provides the combined digital waveform as an output digital waveform signal, signal 21, to digital-to-analog converter 30. Digital-to-analog converter 30 converts the digital waveform signal, signal 21, into an analog waveform signal 31. It should be appreciated that analog waveform signal 31 includes both a high-frequency component and a low-frequency component. In an embodiment, the high-frequency component has a frequency above 500 KHz, for example 1 MHz, and the low-frequency component has a frequency less than or equivalent to the mechanical bandwidth of the MEMS sensor 10, for example between 1 Hz and 10 kHz.

Digital-to-analog converter 30 provides the analog waveform signal 31 as an input to low-pass filter 40. Low-pass filter 40 filters the received signal 31 to remove the high-frequency component, and provides the remaining low-frequency component to signal evaluation circuitry 50 as a reference low-frequency waveform. In an embodiment, the remaining low-frequency component has a frequency less than or equivalent to the mechanical bandwidth of the MEMS sensor 10, for example between 1 Hz and 10 kHz.

Digital-to-analog converter 30 also provides signal 31 as an analog waveform signal input to moveable mechanical element 14 of MEMS sensor 10. MEMS sensor 10 responds to the applied signal 31 in two ways based on the low-frequency and high-frequency components of signal 31. In response to the low-frequency component of signal 31, moveable mechanical element 14 exhibits a movement response by physically displacing relative to the substrate 12 of MEMS sensor 10. This results from the low-frequency component of signal 31 creating an electromagnetic force that pulls the moveable mechanical portion 14 up and/or down relative to the substrate 12 of MEMS sensor 10, thereby causing the moveable mechanical portion 14 of MEMS sensor 10 to move responsive to the low-frequency component of signal 31. In addition to exhibiting a movement response to signal 31, MEMS sensor 10 also exhibits an electronic capacitive reactance response to the low-frequency component of signal 31. In response to the high-frequency component of signal 31, moveable mechanical element 14 does not exhibit a movement response, but MEMS sensor 10 does exhibit a capacitive reactance response to the high-frequency component.

The physical movement of the moveable mechanical element 14 of MEMS sensor 10 relative to substrate 12 and sense contact 18 of MEMS sensor 10 causes the capacitance at sense contact 18 of MEMS sensor 10 to vary in a manner that corresponds to the magnitude and frequency of the movement of the moveable mechanical element 14 of MEMS sensor 10. In addition, the capacitive reactance response of MEMS sensor 10 to both the low and high-frequency components of signal 31 causes the capacitance at sense contact 18 of MEMS sensor 10 to vary responsive to signal 31. As a result, signal 17, the signal present at sense contact 18 of MEMS sensor 10, is a function of, and corresponds to, both the physical movement response of moveable mechanical element 14 to the low-frequency component of signal 31, and the capacitive reactance response of MEMS sensor 10 to the low and high-frequency components of signal 31. Because of the combination of both the low-frequency and high-frequency component effects, including the physical modulation of moveable mechanical element 14, signal 17 is in the form of an amplitude-modulated waveform.

Signal 17 is provided to gain circuitry 60, where signal 17 is amplified, with the amplified signal, amplified signal 61, being passed on to demodulator 70. As noted above, signal 17 is in the form of an amplitude-modulated waveform. Demodulator 70 processes signal 17 to demodulate signal 17 and remove the carrier wave portion of signal 17. In an embodiment, the carrier wave portion of signal 17 has a frequency between 500 KHz and 10 MHz. After demodulation, demodulator 70 provides the demodulated signal, amplified demodulated signal 71, which includes both high-frequency and low-frequency components, as an output. Low-pass filter 80 receives amplified demodulated signal 71, filters amplified demodulated signal 71 to remove the high-frequency component, and provides the remaining low-frequency component as filtered demodulated signal 81.

Signal evaluation circuitry 50 receives filtered demodulated signal 81, which is the amplified, demodulated, low-frequency component of the signal output at sense contact 18 of MEMS sensor 10. As noted above, signal evaluation circuitry 50 also receives signal 41, the filtered low frequency component of the signal 31 provided as a signal input to moveable mechanical element 14 of MEMS sensor 10 (and sometimes referred to as a reference signal). Signal evaluation circuitry 50 compares the amplitude of filtered demodulated signal 81 with the amplitude of signal 41 to determine the change in amplitude introduced into the input signal 31 by MEMS sensor 10 (and referred to as the amplitude difference). Signal evaluation circuitry 50 also compares the phase of filtered demodulated signal 81 with the phase of signal 41 to determine the difference in phase introduced into the input signal 31 by MEMS sensor 10 (referred to as the phase difference). Signal evaluation circuitry 50 provides the amplitude and phase difference information to processor 20 via output signal 51.

Responsive to parameter determination and processing program 200, processor 20 evaluates the amplitude and phase difference information received from signal evaluation circuitry 50 via signal 51, and determines, based on calculations, various parameters of MEMS sensor 10. In an embodiment, processor 20 may use the amplitude and phase difference information to determine various parameters of MEMS sensor 10, such as, for example, resonant frequency, harmonic distortion, damping and frequency response. In an embodiment, processor 20 utilizes Fast Fourier Transforms (FFTs) to evaluate the amplitude and phase difference information to determine harmonic characteristics and parameters of MEMS sensor 10. Processor 20 may also use the amplitude and phase difference information to determine the quality and the integrity of the MEMS sensor 10, or if there is an impairment to the normal operation of the MEMS sensor 10, for example abnormal operation due to broken or non-responsive structure or foreign particle. Processor 20 may also use the amplitude and phase difference information to determine other parameters, such as, for example, spring constant, thickness of MEMS sensor 10, space between beams and/or capacitors on MEMS sensor 10, and other characteristics of MEMS sensor 10. In an alternative embodiment, parameter determination and processing program 200 in processor 20 first evaluates signal 51 received from signal evaluation circuitry 50 to calculate and/or estimate various parameters such as, for example, the etching bias thickness of the silicon of MEMS sensor 10, side slope of the MEMS sensor 10, critical dimension (CD) of MEMS sensor 10, and fringe of MEMS sensor 10. Parameter determination and processing program 200 then uses these parameters to calculate estimates of the mass, spring constant, and other properties of the MEMS sensor 10. Finally, parameter determination and processing program 200 may use the amplitude and phase difference information and/or MEMS sensor 10 parameters determined in part by using the amplitude and phase difference information, to determine trim, compensation and/or calibration values associated with MEMS sensor 10. Application systems using MEMS sensor 10 may employ the determined trim values for compensation and/or calibration, allowing MEMS sensor 10 output signals to be properly utilized by the application. It should be appreciated that parameter determination and processing program 200 could be configured to periodically re-calculate the trim values for the compensation and/or calibration, such that those values more accurately reflect the characteristics of MEMS sensor 10 as those characteristics shift over time. It should also be appreciated that parameter determination and processing program 200 could be configured to store the trim values for the compensation and/or calibration in a memory location for access and use by other devices and systems utilizing MEMS sensor 10.

In summary, by applying a known signal having both high-frequency and low-frequency sinusoidal components to MEMS sensor 10, MEMS sensor 10 is caused to provide as an output an amplitude-modulated waveform containing high-frequency and low-frequency components. The low-frequency components of this waveform are compared with the applied known signal to determine electromechanical parameters, such as resonant frequency, harmonic distortion, and damping of the MEMS sensor 10 through which the known signal has passed. These parameters may then be used by systems employing the MEMS sensor 10 to correlate output signals provided by MEMS sensor 10 with external forces to which the systems are subjected. In an embodiment electrical-mechanical physical models and/or statistical models established and verified by a representative data set of measurements of various MEMS sensor may be used to determine the frequency above which MEMS sensors do not mechanically move responsive to the applied frequency.

Once parameter determination and processing program 200 has determined parameters of MEMS sensor 10, parameter determination and processing program 200 may store the determined parameters associated with MEMS sensor 10, including, for example, trim values for the compensation and/or calibration of MEMS sensor 10, in a memory location in a system employing the MEMS sensor 10, or may compare the determined parameters to parameters already stored in the system and overwrite the stored values with the newly determined values if appropriate in order to keep the MEMS sensor 10 properly compensated and/or calibrated. By using updated parameters, an accurate determination of the characteristics of various stimuli applied to the MEMS sensor 10 may continue to be made in spite of changes to the physical and/or electromechanical characteristics of the MEMS sensor 10 over time. These updated trim values for the compensation and/or calibration may be used by applications utilizing the MEMS sensor 10 to properly adjust the output signals provided by MEMS sensor 10 to compensate for characteristics of MEMS sensor 10, and changes in those characteristics over time. In an embodiment, parameter determination is performed on a MEMS sensor 10 after the device has been manufactured, but before it has been placed in an application (in which case the elements of FIG. 2 except for MEMS sensor 10 itself may be implemented in a tester or other hardware device to which sense contact 18 and moveable mechanical element 14 of MEMS sensor 10 are electrically connected). Alternatively, parameter determination is performed on a MEMS sensor 10 after the device has been placed in an application, in which case the logic and memory necessary to carry out the parameter testing (and generally illustrated in FIG. 2) may be present in the same application module or system in which MEMS sensor 10 is located. In this case, parameter determination can be made at any time during the life of the system in which MEMS sensor 10 is operating.

Figure 3:
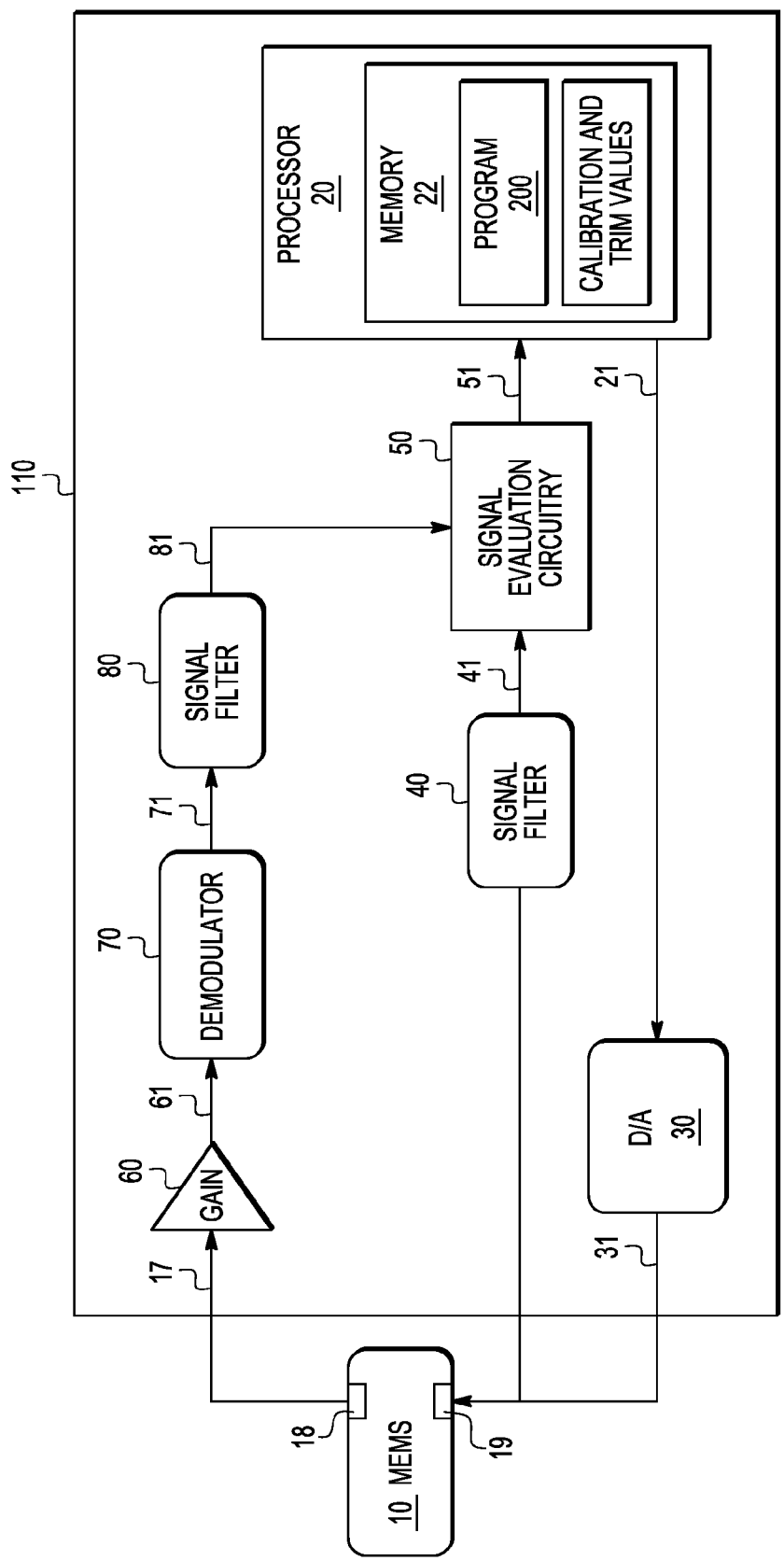
FIG. 3 shows a block diagram of a sensor parameter identification and evaluation system configured in accordance with the teaching of an alternative embodiment.

FIG. 3 shows a block diagram of a sensor parameter identification and evaluation system configured in accordance with the teaching of another alternative embodiment. In this embodiment, the elements generally illustrated in FIG. 2, except for the MEMS sensor 10 itself, are shown implemented in separate tester hardware 110. Tester hardware 110 is electronically coupled to MEMS sensor 10 at sense contact 18 and the moveable mechanical element 14 via the surface contact for pedestal 19. It should be appreciated that tester hardware 110, when electrically coupled to a MEMS sensor 10 and executing Program 200 as described above, functions in a similar fashion to the embodiment generally illustrated in FIG. 2. In addition, in yet other alternative embodiments, tester hardware 110 may be configured such that certain of the functions, such as, for example, signal filters 80 and 40, demodulator 70, gain circuitry 60, and signal evaluation circuitry 50, may be combined into one or more integrated circuit chips in tester 110, or may be implemented in software run on tester 110.

Figure 4:
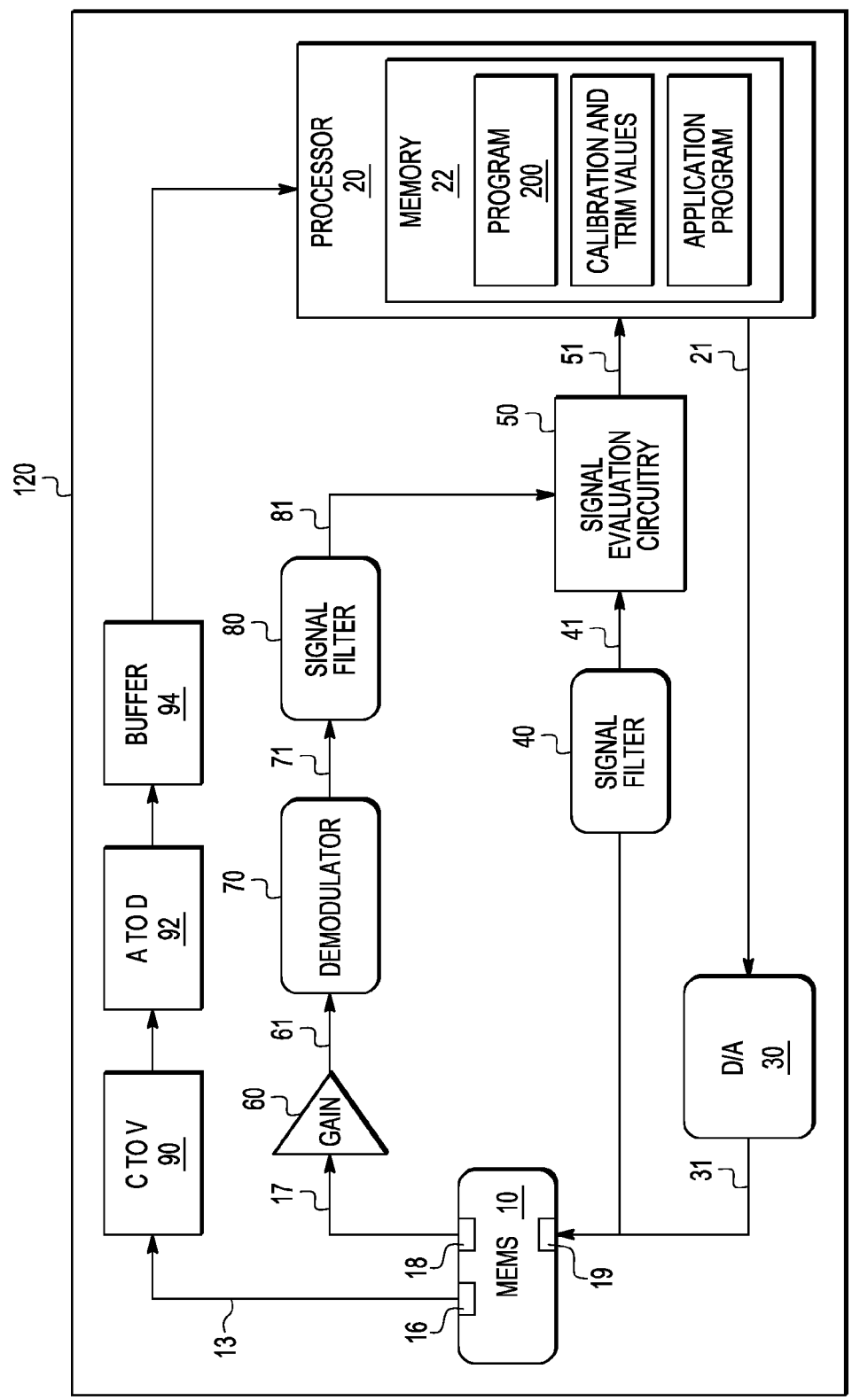
FIG. 4 shows a block diagram of a sensor parameter identification and evaluation system configured in accordance with the teaching of another alternative embodiment; and, FIG. 5 shows a flow chart of a sensor parameter identification and evaluation method, according to an embodiment.

FIG. 4 shows a block diagram of a sensor parameter identification and evaluation system configured in accordance with the teaching of another alternative embodiment. In this alternative embodiment, the elements generally illustrated in FIG. 2 are shown implemented along with additional application circuitry in a stand-alone application module 120. MEMs sensor 10 may be implemented on a separate integrated circuit from the rest of stand-alone application module 120. The circuitry other than the additional application circuitry operates as discussed above with respect to FIG. 2. The additional application circuitry is configured to allow processor 20 of stand alone application module 120, to operate in an application system, using information provided by the additional circuitry and derived from MEMS sensor 10. The additional application circuitry includes a sense contact 16 of MEMS sensor 10 electrically coupled to capacitance-to-voltage circuitry 90 (referred to herein as C-to-V 90). C-to-V 90 is configured to receive an input capacitance from MEMS sensor 10 and convert it to a voltage output. C-to-V 90 is electrically coupled to analog-to-digital (A-to-D) conversion circuitry A-to-D 92. A-to-D 92 is configured to receive a voltage signal from C-to-V 56, convert the received analog voltage signal to a digital signal representative of the analog voltage signal, and provide the digital voltage signal as a digital voltage signal output from A-to-D 92. A-to-D 92 is shown electrically coupled to a buffer 94. Buffer 94 is configured to store the digital voltage signal provided by A-to-D 92, and to provide the digital voltage signal to processor 20 such that processor 20 may use the signal to monitor the operation of MEMS sensor 10 and perform various programs and algorithms utilizing the digital voltage signal.

In operation, the additional application circuitry is configured to monitor, at sense contact 16 of MEMS sensor 10, an output capacitance signal corresponding to the motion of moveable mechanical element 14 of MEMS sensor 10. C-to-V 90 converts this capacitance signal to a voltage, and provides this output voltage signal to A-to-D 92. The output voltage signal is buffered by buffer 94, and subsequently provided to processor 20. It should be appreciated that the movable mechanical element 14 of MEMS sensor 10 will be moving responsive to physical forces (stimulus) to which the MEMS sensor 10 is being subjected. In this case, the capacitive output of MEMS sensor 10 will correspond to the motion of the moveable mechanical element 14 of MEMS sensor 10 responsive to the physical stimulus. C-to-V 90 receives this capacitive output of MEMS sensor 10, converts it to a voltage, and provides the voltage signal to buffer 94.

Buffer 94 buffers the voltage signal and provides the buffered signal to processor 20. Responsive to an Application Program running in processor 20, processor 20 evaluates the buffered signal, and determines, based on the signal (and using the trim values for the compensation and/or calibration associated with MEMS sensor 10), how much the moveable mechanical element 14 of MEMS sensor 10 has moved. The trim values for the compensation and/or calibration have been determined and stored previously, and may be used by applications employing MEMS sensor 10 to compensate for changes in characteristics of MEMS sensor 10 over time. If the moveable mechanical element 14 of MEMS sensor 10 has moved beyond a predetermined amount, or has moved in a predetermined pattern, processor 20 is configured to cause some action to be taken in stand-alone application module 120, or in systems in which stand-alone application module 120 may be present. For example, processor 20 may determine that a change in motion of, or forces applied to, the application module 120 or vehicles or structures in which application module 120 may be situated, has occurred. A change in motion could comprise acceleration, change in acceleration, velocity, rotation, pressure, or other forces or motion. Processor 20 may also determine the magnitude of such changes.

By utilizing one application module 120 to include both application and testing functions, real-time testing and calibration of application modules 120 may be performed while continuing to utilize the MEMS sensor 10 in the target application, and without the need to disable the target application or remove MEMS sensor 10 physically from the application for testing. In an alternative embodiment, sense contacts 16 and 18 may be a single contact electrically coupled to both C-to-V 90 and gain circuitry 60.

Figure 5:
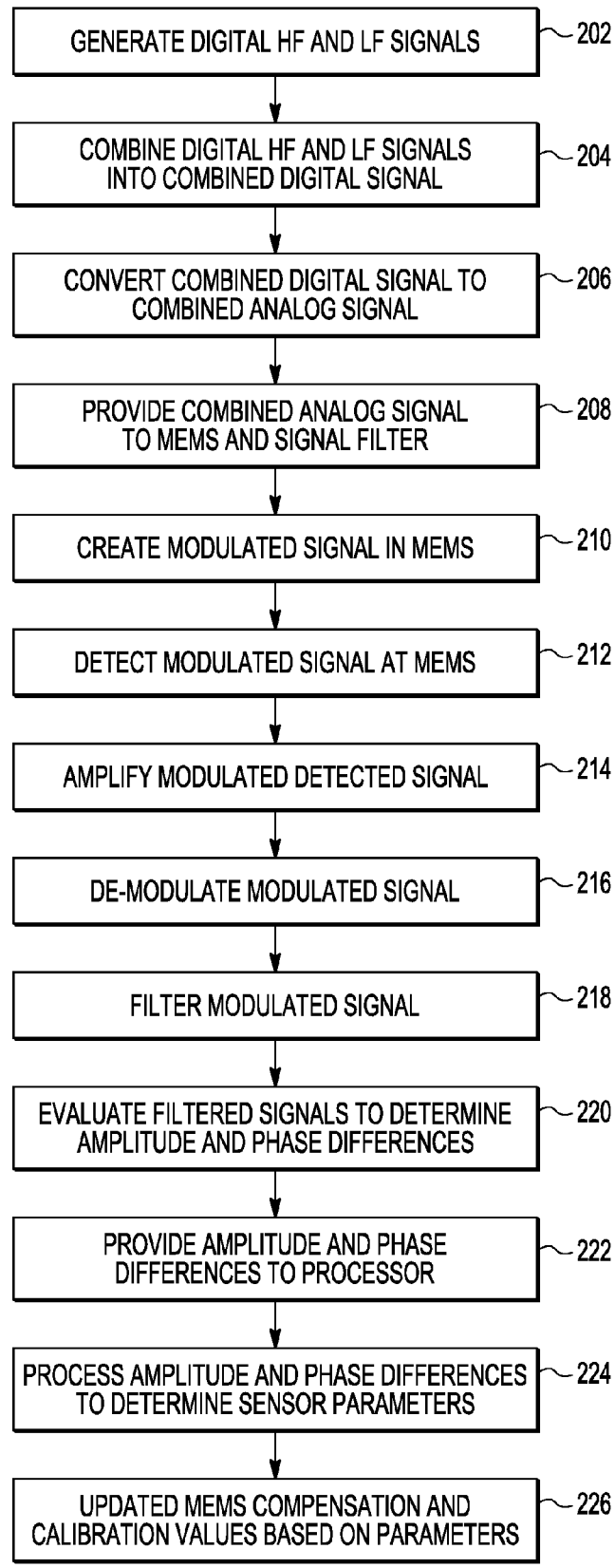

FIG. 5 shows a flow chart of a sensor parameter identification and evaluation method 200, according to an embodiment. In an embodiment, the method 200 is implemented by the execution of parameter determination and processing program 200. In a first operation 202, a high-frequency digital signal and a low-frequency digital signal are generated by a processor 20 (FIG. 1). The high-frequency signal is at a high enough frequency that application of the signal to MEMS sensor 10 will not cause the moveable mechanical element 14 of MEMS sensor 10 to mechanically move. In an embodiment, the high-frequency signal is at a frequency above 500 KHz, for example 1 MHz. The low-frequency signal is at a low enough frequency that application of the low-frequency signal to a MEMS sensor 10 will cause the moveable mechanical element 14 of the MEMS sensor 10 to mechanically move. In an embodiment, the low-frequency signal is at a frequency less than or equivalent to the mechanical bandwidth of the MEMS sensor 10, for example between 1 Hz and 10 kHz.

In a second operation 204, the high-frequency and low-frequency digital signals are combined into a single combined digital signal by adding or summing the two signals. In a third operation 206, the combined digital signal is converted into a combined analog signal. In a fourth operation 208, the combined analog signal is provided to MEMS sensor 10 and a low-pass signal filter. In a fifth operation 210, a modulated signal is created in the MEMS sensor 10 responsive to the combined analog signal. In a sixth operation 212, the modulated signal is detected at an output of MEMS sensor 10.

In a seventh operation 214, the detected modulated signal is amplified. In eighth operation 216, the amplified, detected modulated signal is demodulated to remove the carrier component of the signal. In a ninth operation 218, the demodulated signal is filtered in a low-pass filter to remove high frequency components. In a tenth operation 220, the filtered demodulated signal is evaluated and compared with the filtered combined analog signal to determine the amplitude and phase differences between the signals. In an eleventh operation 222, the amplitude and phase differences are provided to a processor. In a twelfth operation 224, the amplitude and phase differences are processed to determine parameters of the MEMS sensor 10. In a thirteenth operation 226, the system utilizing the MEMS sensor 10 is updated with the new compensation and calibration parameters.

In an alternative embodiment (not shown), all of the components generally illustrated in FIG. 2 may be formed together on a single substrate and provided as a unitary device. In yet another alternative embodiment (not shown), all of the components generally illustrated in FIG. 2 may be coupled together in a single module.

Embodiments described herein provide for the identification of parameters of MEMS devices without a need for applying physical forces external to the MEMS device, and without a need for removing the MEMS device from systems in which it is operating. Systems and methods are provided for testing MEMS devices and identifying MEMS device parameters throughout the lifetime of those MEMS devices, even on a continuous basis, while those devices remain located and functioning in systems employing the MEMS devices. Thus, systems and methods achieving design objectives of low-cost MEMS parameter identification, repeated testing of MEMS sensors throughout the life of the MEMS sensors to identify MEMS parameters, testing of MEMS sensors without removal of the sensors from the application, and re-calibration of MEMS devices during the life of the MEMS devices are provided. The systems and methods further allow for reduced testing costs, real-time calibration, and improved reliability of the system utilizing the MEMS devices. The systems and methods provide for the testing and evaluation of the electromechanical response of any MEMS device capable of receiving an electromagnetic signal into the movable element of the MEMS device and providing an output signal indicative of the motion of the movable mechanical element of the MEMS device.

A microelectromechanical systems (MEMS) system comprising a MEMS sensor, a control circuit in electrical communication with the moveable mechanical element of the MEMS sensor, and demodulation circuitry in electrical communication with the MEMS sensor and the control circuit. The MEMS system is configured to demodulate the MEMS output signal corresponding to motion of the moveable mechanical element and provide the demodulated signal to the control circuit. The control circuit is configured to evaluate the demodulated signal to determine at least one characteristic of the MEMS sensor. Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of determining a parameter of a MEMS sensor in a system, comprising:

generating an input signal including at least one high-frequency component selected to not cause physical oscillation of a moveable mechanical element of a MEMS sensor, and one low-frequency component selected to cause physical oscillation of a moveable mechanical element of a MEMS sensor;

providing the input signal to a MEMS sensor comprising at least one moveable mechanical element to cause a modulated output signal comprising high and low frequency components to be provided from the MEMS sensor;

de-modulating the modulated output signal provided by the MEMS sensor;

filtering the de-modulated output signal to remove the high frequency components; and, evaluating the de-modulated, filtered signal to determine at least one characteristic of the MEMS sensor.

2. A method as claimed in claim 1, wherein the step of evaluating the de-modulated output signal further includes the step of comparing the de-modulated, filtered signal to the input signal to determine at least one difference between the signals.

3. A method as claimed in claim 2, wherein the at least one determined difference includes at least one of amplitude and phase differences.

4. A method as claimed in claim 3, further including the step of utilizing the at least one characteristic of the MEMS sensor to update at least one of a compensation or calibration parameter for the MEMS sensor.

5. A method as claimed in claim 1, wherein the steps are performed in an application module configured to perform functions other than exclusively testing using an output from a MEMS sensor mounted in the application module, and wherein the module is configured to use output from the MEMS sensor to determine a function performed by the application module.

6. A method as claimed in claim 1, wherein the steps are performed in equipment configured to temporarily electrically couple to a various MEMS sensor for purposes of testing the MEMS sensors.

7. A method as claimed in claim 1 wherein the low frequency component is a frequency between 1 kHz and 10 kHz, and wherein the at least one high frequency component is a frequency greater than 500 kHz.

8. A method as claimed in claim 1 wherein the input signal is generated as a digital signal and converted to an analog signal prior to being provided to the MEMS sensor.

9. A method as claimed in claim 1 further comprising:
prior to the demodulating, amplifying with an amplifier the modulated output signal.

10. A method as claimed in claim 1 wherein the generating and the evaluating are performed by a control circuit executing code.

11. A method as claimed in claim 2 further comprising:
filtering the input signal to provide a filtered input signal, wherein the step of comparing the de-modulated, filtered signal to the input signal to determine at least one difference between the signals includes comparing the de-modulated, filtered signal to the filtered input signal.

12. A method as claimed in claim 11 wherein the filtering the input signal includes removing the at least one high-frequency component selected to not cause physical oscillation of a moveable mechanical element of a MEMS sensor from the input signal.

13. A method as claimed in claim 11 wherein the input signal is generated as a digital signal and converted to an analog signal prior to being provided to the MEMS sensor, wherein the filtering the input signal includes filtering the input signal after it has been converted to an analog signal.

14. A method as claimed in claim 1 further comprising:
converting an electromagnetic output of the MEMS sensor to a voltage signal;
converting the voltage signal to a digital voltage signal;
determining by a control circuit from the digital voltage signal, at least one of a change in motion of the MEMS sensor or a change in forces applied to the MEMS sensor.

15. A method as claimed in claim 14 wherein the electromagnetic output and the modulated output signal are generated from a same output of the MEMS sensor.

16. A method as claimed in claim 1 further comprising:
storing in a memory, the at least one characteristic of the MEMS sensor determined from the evaluating.

17. A method as claimed in claim 16 further comprising:
overwriting at least one previously-stored characteristic with the at least one characteristic of the MEMS sensor determined from the evaluating.

18. A method as claimed in claim 1 wherein the demodulating the modulated output signal includes removing a carrier wave portion of the modulated signal.

19. A method of determining a parameter of a MEMS sensor in a system, comprising:
generating an input signal including at least one high-frequency component selected to not cause physical oscillation of a moveable mechanical element of a MEMS sensor, and one low-frequency component selected to cause physical oscillation of a moveable mechanical element of a MEMS sensor;
providing the input signal to a MEMS sensor comprising at least one moveable mechanical element to cause an output signal comprising high and low frequency components to be provided from the MEMS sensor;
filtering the output signal to remove the high frequency components;
filtering the input signal to provide a filtered input signal, wherein the filtering the input signal includes removing the at least one high-frequency component;
evaluating the output signal after the filtering the output signal to determine at least one characteristic of the MEMS sensor, wherein the evaluating the output signal further includes comparing the output signal to the filtered input signal to determine at least one difference between the signals.

20. A method as claimed in claim 19 wherein prior to filtering the output signal, demodulating the output signal.

* * * * *